(12) United States Patent
Schaefer

(10) Patent No.: US 11,640,523 B2
(45) Date of Patent: *May 2, 2023

(54) METHOD FOR TRAINING A NEURAL NETWORK, METHOD FOR AUTOMATICALLY CHARACTERIZING A MEASUREMENT SIGNAL, MEASUREMENT APPARATUS AND METHOD FOR ANALYZING

(71) Applicant: Rohde & Schwarz GmbH & Co. KG, Munich (DE)

(72) Inventor: Andrew Schaefer, Oberhaching (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 630 days.

This patent is subject to a terminal disclaimer.

(21) Appl. No.: 16/730,279

(22) Filed: Dec. 30, 2019

(65) Prior Publication Data

US 2020/0210823 A1 Jul. 2, 2020

Related U.S. Application Data

(60) Provisional application No. 62/787,547, filed on Jan. 2, 2019.

(51) Int. Cl.
*G06N 3/00* (2006.01)
*G06N 3/063* (2023.01)
(Continued)

(52) U.S. Cl.
CPC ............ *G06N 3/063* (2013.01); *G01R 13/02* (2013.01); *G06N 3/08* (2013.01); *G06N 20/10* (2019.01)

(58) Field of Classification Search
CPC .......... G06N 3/063; G06N 3/08; G06N 20/10; G01R 13/02; G01R 31/31708; G01R 13/029
(Continued)

(56) References Cited

U.S. PATENT DOCUMENTS 5,495,168 A 2/1996 de Vries
2008/0071488 A1 3/2008 Cake et al.
(Continued)

FOREIGN PATENT DOCUMENTS

EP 3 293 528 A2 3/2018

*Primary Examiner* — Thuy N Pardo
(74) *Attorney, Agent, or Firm* — Westman, Champlin & Koehler, P.A.

(57) ABSTRACT

The present invention relates to a method for training a signal characterization neural network. The method comprises the steps of: providing a measurement signal having at least one distortion; assigning at least one predefined signal integrity identifier to a corresponding distortion within the measurement signal; generating at least one input training vector based on the provided measurement signal and the corresponding assigned signal integrity identifier; and applying the generated input training vector on input terminals of the signal characterization neural network for training the signal characterization neural network. The present invention also relates to a method for automatically characterizing a measurement signal. The present invention further relates to a measurement apparatus and a corresponding method for analyzing a waveform signal.

31 Claims, 7 Drawing Sheets

(51) Int. Cl.
*G01R 13/02* (2006.01)
*G06N 20/10* (2019.01)
*G06N 3/08* (2023.01)

(58) Field of Classification Search
USPC .............................. 706/41, 15, 44; 345/440.1
See application file for complete search history.

(56) References Cited

U.S. PATENT DOCUMENTS

| | | |
|---|---|---|
| 2014/0163914 A1* | 6/2014 | Alley .................... G01R 13/02 |
| | | 702/68 |
| 2015/0301086 A1 | 10/2015 | Schaefer et al. |
| 2018/0074096 A1 | 3/2018 | Absher et al. |
| 2018/0356445 A1* | 12/2018 | Vollum .............. G01R 13/0272 |
| 2019/0049496 A1* | 2/2019 | Sudhakaran ....... G01R 31/2841 |
| 2019/0068411 A1* | 2/2019 | Tan ................... H04L 25/03853 |
| 2019/0128925 A1* | 5/2019 | Barthel ................ G01R 13/029 |
| 2019/0304434 A1* | 10/2019 | Reber ................. G06K 9/6262 |
| 2019/0324432 A1* | 10/2019 | Cella ....................... G06N 3/084 |
| 2020/0348388 A1* | 11/2020 | Jaynes ............... H04B 17/3913 |
| 2021/0357741 A1* | 11/2021 | Jha ........................... G06N 3/04 |
| 2022/0104775 A1* | 4/2022 | Rundo .................. A61B 5/021 |
| 2022/0148564 A1* | 5/2022 | Reber ................. G06K 9/6262 |

* cited by examiner

METHOD FOR TRAINING A NEURAL NETWORK, METHOD FOR AUTOMATICALLY CHARACTERIZING A MEASUREMENT SIGNAL, MEASUREMENT APPARATUS AND METHOD FOR ANALYZING

CROSS-REFERENCE TO RELATED APPLICATION

This application claims the benefit of U.S. provisional application number 62/787,547, filed on Jan. 2, 2019, the content of which is hereby incorporated by reference in its entirety.

TECHNICAL FIELD

The present invention relates to a method for training a signal characterization neural network and to a method for automatically characterizing a measurement signal. The present invention further relates to a measurement apparatus and a corresponding method for analyzing a waveform signal.

BACKGROUND

Although applicable in principle to any kind of digital measurement device and measured waveform, the present invention and its underlying problem will be hereinafter described in combination with measuring a signal by employing a digital oscilloscope.

Oscilloscopes are very suitable measurement devices for directly displaying the temporal behavior and frequency response characteristic of measured signals. Today, mainly digital storage oscilloscopes (DSO)—or shortly digital oscilloscopes—are used rather than analogue oscilloscopes because of the advanced trigger, storage, display and measurement features which a digital oscilloscope typically provides. Digital oscilloscopes are configured to convert the measured voltage values for each channel into digital data streams at discrete points in time after analog amplification. These data streams are digitally analyzed in order to provide numerical values as well as visual displays. The analyzed data is then suitably processed and stored in a memory.

However, due to increasing performance ability of measurement devices, for example increasing resolution and sampling rate, modern digital oscilloscopes produce large amounts of data, which has to be analyzed and processed in a suitable manner without long blind times. Hence, it will become difficult to evaluate and interpret the measurement results, for example a waveform displayed by an oscilloscope. Furthermore, a full analysis of a measurement sequence may be very time-consuming or needs a high processor performance.

For this purpose, modern digital oscilloscopes perform decimation on the incoming data stream in order to summarize the signal behavior within each decimation interval. In digital signal processing, decimation or down-sampling refers to the reduction of a digital signal's sampling rate. When decimation is performed on a sequence of samples of a signal, it produces an approximation of the sequence that would have been obtained by sampling the signal at a lower sampling rate. Decimation can therefore be understood as a kind of data reduction or data compression. This can be useful to reduce the amount of data which needs to be recorded.

Currently, a variety of decimation techniques are available, such as sample decimation, high resolution decimation and peak decimation. Current digital oscillators employ one of these decimation types in either path. However, one difficulty with theses decimation types is that a significant amount of useful information and as such the signal integrity gets lost.

SUMMARY

Against this background, there is the need to provide an improved approach for preserving the measured information when applying data reduction techniques such as decimation. In particular, the present invention aims to provide a simple analysis of a waveform of a signal and/or an improved evaluation of a waveform of a signal.

The present invention solves this problem by a measurement apparatus and by methods having the features of the independent claims. Further embodiments and aspects are subject-matter of the dependent claims.

According thereto, the following is provided:

According to a first aspect, a method for training a signal characterization neural network is provided. The method comprises the steps of: Providing a measurement signal having at least one distortion; assigning at least one predefined signal integrity identifier to a corresponding distortion within the measurement signal; generating at least one input training vector based on the provided measurement signal and the corresponding assigned signal integrity identifier; and applying the generated input training vector on input terminals of the signal characterization neural network for training the signal characterization neural network.

According to another aspect, a method for automatically characterizing a measurement signal is provided. The method comprises the steps of: Providing a signal characterization neural network; providing a measurement signal having at least one characteristic property; generating a histogram representation of the provided measurement signal; generating an input vector based on the generated histogram representation; and applying the generated input vector on input terminals of the signal characterization neural network for automatically identifying the at least one characteristic property within the provided measurement signal.

According to a further aspect, a measurement apparatus for analyzing a waveform of a signal is provided. The apparatus comprises an acquisition device, a segmenting device, a processing device and an output device. The acquisition device is configured to acquire a waveform of a signal, in particular to acquire a waveform of a measured signal. The segmenting device is configured to identify a number of sections in the acquired waveform. In particular, each section may relate to a specific period of time. The processing device is configured to assign a signal integrity identifier to each section of the number of sections in the acquired waveform. The output device is configured to output a representation of the respective assigned signal integrity identifier for each section of the number of sections.

According to still further aspect, a method for analyzing a waveform of a signal is provided. The method comprises a step of acquiring a waveform of a signal, in particular of a measurement signal. The method further comprises a step of identifying a number of sections in the acquired waveform. Further, the method comprises a step of assigning a signal integrity identifier to each section of the number of sections in the acquired waveform. Finally, the method comprises a step of outputting a representation of the respective assigned signal integrity identifier for each section of the number of sections.

The present invention is based on the fact that an analysis of a waveform, i.e. a curve of a signal level over time by analyzing a simple graphical representation of the waveform by a user is a very difficult and time-consuming task. For example, a user has to go through the signal curve and evaluate the waveform for each point in time in order to identify deviations in a measured waveform with respect to a desired waveform. This may be a very exhausting task, and the user may easily overlook a failure in the signal curve. Thus, it is an idea of the present invention to automatically evaluate the waveform of a measured signal.

According to the first and second aspects of the method according to the present invention, an artificial neural network—or shortly neural network or ANN—is employed for this purpose. These neural networks are used on the one hand side for the automatically characterizing of a measurement signal. Applying neuronal networks for analyzing purposes is very smart and effective as it provides real time characterization of measurement signals. However, in order to properly apply the neural networks on the characterizing of a measurement signal, on the other hand side the neural networks has to be trained properly using suitable training data. For this purpose, according to the present invention a specific training data is used and applied to the neural networks, wherein for generating the training data specific measurement signals are used which comprise a predefined distortion. Then, a signal integrity identifier which refers to a characteristic property of the distortion is then assigned to the measurement signals and a training vector is derived from the measurement signal and the corresponding signal integrity identifier. This training vector may then be used for training the neuronal network. As such it is possible to properly train the neuronal network on such training sets which comprise all known distortions. A neuronal network trained like this is highly effective and provides an optimal signal integrity even after decimation of the measurement signal.

By means of a neural network, a powerful analysis of the waveform of the acquired signal can be achieved. In particular, the efficiency and performance of the neural network can be improved depending on appropriate training data. To further improve the performance capability of the neural network, the analysis of the neural network may be applied to the histogram data. In this way, the amount of data to be analyzed by the neural network can be reduced and thus, the computational effort can be minimized.

It is a further idea of the present invention to automatically evaluate the waveform of a measured signal and to provide additional information, which can assist a user when evaluating the waveform of a measured signal. In particular, the present invention aims to provide signal integrity identifiers for specifying the characteristic of the waveform of a measured signal. For this purpose, the waveform of the measured signal may be segmented into multiple successive segments, and a separate signal integrity identifier for each segment of the waveform. Accordingly, the user may check the provided signal integrity identifiers in order to evaluate the measured signal. In this way, the evaluation of the measured signal, in particular of the waveform of the measured signal can be simplified. Thus, the analysis of the waveform can be accelerated, and the probability of overlooking an abnormality in the waveform can be reduced.

The acquisition device may acquire the waveform for any kind of appropriate signal. For example, the signal may be a measurement signal, e.g. a measurement of a voltage over the time. The signal may be provided either as a digital data sequence or as an analogue signal. If the signal is provided as an analogue signal, the signal may be converted to a digital signal, for example by an analogue to digital converter.

The signal may come from any kind of signal source. For example, the signal may be provided by a measurement probe, a probe tip connected to a specific measuring point, an antenna etc. For example, the signal provided to the acquisition device may be a signal for transmitting data. In a possible example, the signal may be a modulated signal. For instance, data may be modulated on a carrier signal, for example a carrier having a predetermined frequency. Accordingly, the measurement signal may be a sinus signal. Furthermore, the measurement signal may be a signal of a pulse width modulation signal. However, any other kind of a measurement signal may be also possible.

The segmenting device may be configured to divide the acquired waveform in multiple sections. For example, the segmenting device may separate the acquired waveform in successive sections having a predetermined length, in particular a predetermined duration or a predetermined number of samples. For example, it may be possible that the length of each section is constant, i.e. the duration or the number of sample is the same for each section. Alternatively, it may be possible that the length of the individual sections may change over time. For example, the length may be dynamically adapted depending on any appropriate parameter.

The length of the individual sections may be determined according to any appropriate parameter. For example, a frequency of the signal may be determined and the corresponding periodic time may be used for dividing the waveform into individual sections. Alternatively, the individual sections of the acquired waveform may be identified based on any other appropriate parameter, for example a rising or falling edge, exceeding or falling below a predetermined threshold or any other appropriate criterion. For example, the signal may relate to a signal of a data stream having a specific clock rate. In this case, the segmentation may be performed based on the clock rate of the data stream.

The processing device may assign appropriate signal integrity identifiers to the individual sections identified by the segmenting device. The signal integrity identifier may provide an appropriate characterization of the waveform in the respective segment. For example, this characterization may specify whether or not the waveform in the respective section is in line with desired requirements. The signal integrity identifier may further provide a characterization of disturbances in the waveform of the respective section of the acquired waveform. The signal integrity identifier may provide the respective information regarding whether the waveform in the respective section is in line with desired requirements or whether disturbances or failures are identified in the respective section. In particular, the signal integrity identifiers may be provided in an abstract form. In other words, the signal integrity identifier provides an abstract indication, which is provided in addition or instead of a detailed representation of the waveform of the measured signal. In this way, the signal integrity identifier can be provided as a number of standardized indications. Accordingly, such standardized indications may be easily recognized by a user. Thus, the user can grasp the signal integrity identifier very easily.

The output device may provide the representation of the signal integrity identifier, which is assigned to a section of the acquired waveform in any appropriate manner. For example, the representation may be provided on a display as an optical indication. Additionally, or alternatively, it may be also possible to output the signal integrity identifier in any other appropriate manner, for example by an acoustical signal, e.g. a sound signal is output if the waveform of the signal does not correspond to a desired theoretical waveform. In another example, a lamp may be switched on or may flash if a deviation from the theoretical desired waveform is determined. However, any other appropriate schema may be used for indicating the signal integrity identifiers. Thus, the output device may comprise a display, a lamp, a loudspeaker or any other appropriate device for outputting the representation of the assigned signal integrity identifier.

The measurement apparatus, in particular the acquisition device, the segmenting device, the processing device and/or the output device may be realized by hardware elements. Furthermore, these elements may be also implemented at least in part by software. For this purpose, instructions may be stored in a memory that is coupled to a processor, for example a general purpose processor, via a memory bus. The processor may further execute an operating system that loads and executes instructions. The processor may be, for example an Intel processor that runs an operating system that loads and executes the instructions. Alternatively, the processor may be a processor of a measurement device that may run an embedded operating system that loads and executes the instructions.

Further embodiments of the present invention are subject of the further sub-claims and of the following descriptions referring to the drawings.

In a preferred embodiment of the method for training the neural network, a histogram representation of the measurement signal is generated. The generated histogram representation may then be used for generating the input training vector for training the signal characterization neural network.

In a possible embodiment, the histogram representation is provided in the form of a pulse-width histogram.

In an alternative or additional embodiment, the histogram representation is provided in the form of a time-domain histogram.

In an alternative or additional embodiment, the histogram representation is provided in the form of an eye pattern.

In another aspect of the method, an assigned signal integrity identifier refers to at least one of: a runt, a glitch, a duty cycle distortion, a slew rate, a crosstalk, intersymbol interferences, reflections, ripples, jitters, noise.

According to an additional embodiment, the measurement signal is provided by a device under test. In particular, a known defective measurement device which has been fetched from the production line may be employed for providing the measurement signals.

According to another embodiment, the measurement signal is provided by an analogue or digital signal generator. A signal generator is an electronic device that generates repeating or non-repeating electronic signals in either the analogue or the digital domain. There are many different types of signal generators with different purposes and applications, such as RF and microwave signal generators, pitch generators, arbitrary waveform generators, digital pattern generators, frequency generators and the like. The signal generator may be embedded in a hardware device, however, also flexible, programmable software tone generators may also be used.

In an alternative or additional embodiment, the measurement signal is provided by an oscilloscope or a spectrum analyzer.

In a particular embodiment, the measurement signal is provided by a software application, such as Matlab.

In a possible embodiment of the measurement apparatus, the processing device assigns the signal integrity identifiers based on at least one characteristic property of the acquired waveform in the respective section.

For this purpose, the processing device may analyze the waveform of the signal. In particular, the processing device may analyze the waveform for each section separately. The processing device may verify whether or not the waveform in the respective section matches specific conditions. The specific condition may define, for example, an ideal desired waveform. Further, specific conditions may be defined for a number of one or more specific disturbances or failures. Accordingly, it is possible to determine whether the waveform in the respective section fulfills the requirements for a desired signal or whether a specific predetermined disturbance or failure can be identified in the waveform of the respective section.

In a possible embodiment, the at least one characteristic property may comprise at least one of the following properties: an error-free waveform, a runt, a glitch, duty cycle distortion, slew rate, crosstalk, intersymbol interference, reflection, noise or ripple. However, it is understood that any further kind of property, in particular any kind of distortion or failure may be also identified based on a characteristic property in a section of the waveform. In particular, for each specific property, it may be possible to specify predetermined characteristics, and the specified predetermined characteristics may be identified in the section of the waveform.

In a possible embodiment, the representation of the signal integrity identifier comprises at least one of a graphical representation, an alphanumeric element, in particular text, a color or an audio output.

The representation of the signal integrity identifier may be provided as an abstract element. For example, the abstract element may be visualization or an acoustic signaling. However, any other kind of representation may be also used for providing the signal integrity identifier to a user. For example, it may be possible to provide a standardized schematic illustration of a waveform. The schematic graphical illustration of the waveform may illustrate a graphical symbol. In particular, the schematic graphical illustration may comprise individual symbols for an error-free waveform and further symbols for each kind of distortion or failure, which might be identified in a section of the acquired waveform. Such an abstract graphical representation allows a very fast and convenient recognition of a state of the waveform in the respective section.

Additionally, or alternatively, it may be also possible to provide an alphanumeric representation, for example a text or the like for indicating the signal integrity identifier of the respective section of the acquired waveform. For example, standardized text elements or acronyms may be used for indicating the respective signal integrity identifiers. Furthermore, it may be also possible to apply different colors depending on the respective signal integrity identifier. For example, a green color may be used for indicating an error-free waveform. Further colors may be used for indicating deviations or failures. For example, a red color may be used for indicating failures. However, it may be also possible to use a number of different colors for indicating different types of signal integrity identifiers. The different colors may be applied, for example to the schematic representation of the signal integrity identifier. However, it may be also possible to apply the different colors to a representation of the real waveform of the acquired signal. Furthermore, it may be also possible to apply the respective color to a background at a position of the respective section of the waveform. However, any other scheme for applying different colors may be also possible.

Furthermore, it may be also possible to provide an audio output depending on the identified signal integrity identifier. For example, a frequency of an output signal may change depending on the respective signal integrity identifier. Furthermore, it may be possible to output only an audio signal if a failure or a distortion is detected in a section of the acquired waveform.

Any other kind of indicating the respective signal integrity identifiers may be also possible. For example, it may be possible to indicate the kind of signal integrity identifier by a lamp, in particular a LED. For example, the color of the lamp may change depending on the respective signal integrity identifier, or the lamp may be switched on or may flash depending on the respective signal integrity identifier.

In a possible embodiment, the output device is configured to display a representation of the waveform of the signal and to output a representation of the signal integrity identifier in association with the displayed representation of the waveform of the signal.

Accordingly, by providing the original waveform of the signal together with a representation of the signal integrity identifier, it is possible to easily analyze the waveform of the signal and detect abnormal sections, for example sections having a distortion of a failure. Furthermore, the user can easily recognize the kind of failure or distortion based on the provided representation of the signal integrity identifier. In this way, the positions and the type of distortion of failure can be easily identified. Thus, the time for analyzing the waveform of the signal can be minimized, and the probability for overlooking a failure or distortion in the acquired signal can be reduced.

In a possible embodiment, the output device is configured to automatically zoom the displayed representation of the waveform. In particular, the output device may zoom into a position relating to a predetermined signal integrity identifier. Accordingly, by automatically zooming the representation of the waveform of a signal, or at least providing the option for an automatically zooming, the examination of the waveform of the signal can be simplified and the time for analyzing the waveform of the signal can be reduced.

In a possible embodiment, the apparatus comprises a selection device. The selection device may be configured to automatically select a section of the respective signal integrity identifier which relates to a predetermined signal integrity identifier.

By providing an automatic selection of a section of the waveform, in particular a section, which relates to a specific signal integrity identifier, the further analysis of the signal waveform can be simplified and accelerated. In particular, further operations, for example a zoom operation or operations for automatically computing specific parameters of the waveform or any other kind of operations may be executed depending on the selection of a section of the waveform. Hence, by automatically providing an appropriate selection, the user can be assisted in the analysis of the waveform of the signal.

In a possible embodiment, the apparatus may comprise an analyzing device. The analyzing device may be configured to compute histogram data of the acquired waveform of the signal.

The histogram data may be computed separately for each section of the acquired waveform. The histogram data may relate to a histogram of the amplitude of the signal and/or a histogram of the sample width. The sample width may specify the number of samples between two measurement values having same or similar values. By acquiring histogram data of the signal, the amount of data may be decimated. Further, histogram data may provide an excellent and efficient basis for further analysis.

In a possible embodiment, the processing device is configured to compare the computed histogram data with a number of prestored reference data. Further, the processing device may be configured to assign the respective signal integrity identifier based on the result of the comparison.

By using histogram data as a basis for an analysis and by further using prestored reference data, for example reference data specifying a fingerprint of specific failures or distortions, a very fast and efficient identification of signal integrity identifiers can be achieved. In particular, a number of appropriate reference data may be stored in an appropriate memory, and the stored reference data may be used for a fast and efficient analysis of the waveform in the individual sections of the acquired waveform.

In a possible embodiment, the analyzing device is configured to divide the waveform of the signal into a number of slices. In particular, the division into the number of slices may be based on at least one threshold value. Further, the analyzing device may determine the histogram data based on the sliced waveform.

By applying appropriate thresholds or limits, a range of the acquired signal waveform may be divided into multiple slices or segments. Based on this segmentation, histogram data may be computed by counting the number of values in each slice. For this purpose, fixed predetermined threshold values may be used. However, it may be also possible to vary or dynamically adapt the threshold values in order to optimize the slicing and the computation of the histogram data. For example, it may be possible to apply equidistant threshold values. However, any other scheme for applying the slices may be also possible.

In a possible embodiment, the computed histogram data may comprise a pulse width histogram. In a pulse width histogram, the histogram data may count the pulse width of the individual pulses in a waveform of a signal. However, it may be also possible to analyze the amplitude (height) of the pulses.

In a possible embodiment, the processing device is configured to assign the signal integrity identifiers based on the determined histogram data. For example, the determined histogram data may be compared with prestored fingerprints. However, it may be also possible to apply any other scheme for identifying an appropriate signal integrity identifier based on histogram data.

In a possible embodiment, the analyzing device may comprise a neural network. The neural network may be configured to identify sections in the waveform. Additionally, or alternatively, the neural network may be configured to assign a signal integrity identifier to a section of the waveform.

By means of a neural network, a powerful analysis of the waveform of the acquired signal can be achieved. In particular, the efficiency and performance of the neural network can be improved depending on appropriate training data. To further improve the performance capability of the neural network, the analysis of the neural network may be applied to the histogram data. In this way, the amount of data to be analyzed by the neural network can be reduced and thus, the computational effort can be minimized.

In a possible embodiment, the apparatus comprises a histogram memory. The histogram memory may be configured to store the computed histogram data. By storing the computed histogram data, the histogram data may be available for further purposes. For example, the stored histogram data may be used for a later displaying of the waveform of the signal, for example on a display for a screen. Furthermore, the stored histogram data may be also used for any other kind of later analysis. By storing the histogram data instead of all samples of the measured signal, the amount of data can be significantly reduced. Furthermore, the histogram data represent preprocessed data, and thus, the further analysis, which can be based on the preprocessed histogram data may be executed more efficiently. Thus, the computational effort can be minimized, and the time for further operations based on the memorized histogram data can be reduced.

With the present invention it is therefore now possible to provide an automatically analysis of a waveform of a measurement signal, and to provide the result of this analysis in an improved and efficient manner In particular, failures or distortions in the waveform of a measurement signal can be easily be identified. Thus, the probability of overlooking such distortions or failures can be reduced. Furthermore, by providing the results of the analysis in form of abstract representations, a user can grasp the results in a very efficient and ergonomic manner In this way, the analysis of a measurement signal, in particular the analysis of the waveform of a measurement signal can be improved.

In a possible embodiment, the analyzing device may comprise a neural network. The neural network may be configured to identify sections in the waveform. Additionally, or alternatively, the neural network may be configured to assign a signal integrity identifier to a section of the waveform.

Where appropriate, the above-mentioned configurations and developments can be combined in any manner. Further possible configurations, developments and implementations of the invention also include combinations, which are not explicitly mentioned, of features of the invention which have been described previously or are described in the following with reference to the embodiments. In particular, in this case, a person skilled in the art will also add individual aspects as improvements or supplements to the basic form of the present invention.

BRIEF DESCRIPTION OF THE DRAWINGS

For a more complete understanding of the present invention and advantages thereof, reference is now made to the following description taking in conjunction with the accompanying drawings. The invention is explained in more detail below using exemplary embodiments, which are specified in the schematic figures of the drawings, in which.

Figure 1:
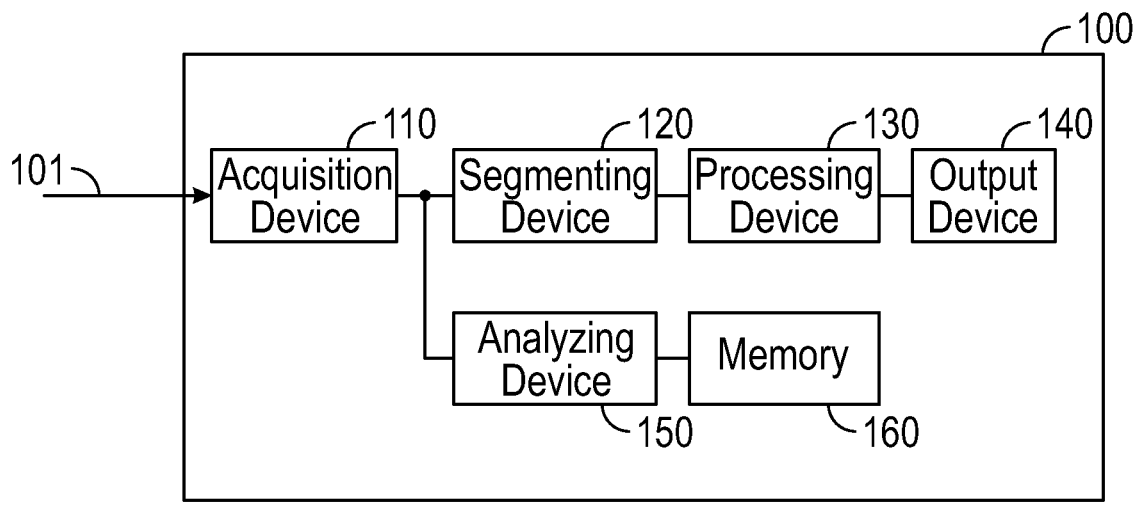
FIG. 1: shows a block diagram of an embodiment of a measurement apparatus according to the present invention.

The append drawings are intended to provide further understanding of the embodiments of the invention. They illustrate embodiments and, in conjunction with the description, help to explain principles and concepts of the invention. Further embodiments and many of the advantages mentioned become apparent in view of the drawings. The elements in the drawings are not necessarily shown in scale.

In the drawings same, functionally equivalent and identical operating elements, features and components are provided with same or similar reference signs in each case, unless stated otherwise.

DETAILED DESCRIPTION OF THE DRAWINGS

FIG. 1 shows a block diagram of an embodiment of a measurement apparatus 100. The measurement apparatus 100 comprises an acquisition device 110, a segmenting device 120, a processing device 130 and an output device 140. The measurement apparatus 100 may also comprise an analyzing device 150. Optionally, the measurement device 100 may further comprise a memory 160.

The measurement device 100 may receive a measurement signal 101 which is either an analogue signal or a digital signal. If the measurement signal 101 is an analogue signal, the analogue measurement signal may be converted into a digital data stream, for instance, by employing a suitable analogue to digital converter (not shown in FIG. 1). The analogue to digital converter may be included in the measurement apparatus 100, in particular in the acquisition device 110. Alternatively, the analogue to digital conversion may be placed outside the measurement apparatus 100 using a separate external analogue to digital converter. Additionally, or alternatively, the data acquisition may be performed in a digital domain and as such a digital measurement signal 101 may be provided to the measurement apparatus 100.

The measurement signal 101 is received by the acquisition device 110 of the measurement apparatus 100 which may be part of an I/O interface. The acquisition device 110 may receive the signal 101 and acquire a waveform of the received measurement signal 101. For example, the acquisition device 110 may apply a normalization of the measurement signal 101. Furthermore, any other appropriate operation, for example amplification, attenuation, filtering, demodulation or the like, is possible either.

The acquired waveform of the measurement signal 101 is provided to the segmenting device 120. Segmenting device 120 may divide the acquired waveform of the measurement signal 101 into multiple sections. In particular, segmenting device 120 may segment the acquired waveform in multiple successive sections. For example, the individual sections of the acquired waveform may be sections having the same predetermined length. The predetermined length may relate to a specific period of time or a specific number of samples. Other suitable measures for dividing the acquired waveform into individual sections may be possible either. Alternatively, it may be also possible to adapt the length for dividing the waveform into individual sections of the acquired waveform. For example, the segmenting device 120 may use a specific property of the acquired waveform for identifying the individual sections. In one possible example, segmenting device 120 may identify a rising or falling edge of the acquired waveform. Thus, a length of the individual sections may be set depending on a distance between two edges, such as adjacent rising and falling edges. However, it is understood that any appropriate measure or property in the acquired waveform of the measurement signal 101 may be also used for setting the length of the individual sections. For example, segmenting device 120 may identify a frequency in the acquired waveform and set the length of the individual sections based on the period length of the respective frequency. Furthermore, a specific threshold may also be used, and the length of the sections may then be set based on intervals of exceeding such a threshold value. Furthermore, any other appropriate scheme for setting a length of the sections of the acquired waveform may be also possible.

Processing device 130 analyzes the waveform of the individual sections of the acquired waveform. For example, the processing device 130 compares the waveform of a section with a specific desired waveform. Accordingly, processing device 130 may determine whether or not the waveform in a specific segment matches the desired waveform or whether the waveform in a segment does not match the predefined requirements. In case the waveform in a segment does not correspond to the desired or predefined requirements, the processing device 130 may determine a type or degree of deviation. The type of deviation may be classified. Accordingly, processing device 130 may assign a signal integrity identifier for each section of the acquired waveform.

Signal integrity refers to a set of measures of the quality of an electrical signal. In digital electronics, a stream of binary values is represented by a voltage (or current) waveform. However, digital signals are fundamentally analogue in nature, and all signals are subject to effects such as noise, distortion, loss and the like. In particular for signals at high bit rates, over longer distances or through various mediums, various effects can degrade the electrical signal. Identifying the signal integrity is needed for properly analyzing and mitigating these effects.

As such, the signal integrity identifier assigned by processing device 130 may specify whether the corresponding waveform in the respective section matches the predetermined requirements, or the signal integrity identifier may specify a kind of deviation of failure in the waveform of the respective section. In this way, the processing device 130 may assign a corresponding signal integrity identifier to each of the sections of the acquired waveform. Thus, each of the sections of the acquired waveform can be characterized by its respective signal integrity identifier. Accordingly, a later analysis of the waveform of the measurement signal 101, in particular an evaluation of the individual sections of the acquired waveform, can be easily performed by taking into account and analyzing the signal integrity identifiers associated to the respective sections of the waveform.

For this purpose, the output device 140 may output a representation of the signal integrity identifier associated to a section of the acquired waveform. In particular, for each section of the acquired waveform, the output device 140 may provide a corresponding representation of the signal integrity identifier. In particular, the representation of a signal integrity identifier may be an abstract representation, for example an abstract representation, which may illustrate the respective signal integrity identifier or characteristics, which are associated with the respective signal integrity identifier. For example, the representation of the respective signal integrity identifier may be provided in an optical format or in an acoustical format. In another aspect, the signal integrity identifiers may also be parameter values. In a still further aspect, several values of the signal integrity identifiers may also be provided in the form of a suitable mathematical function. However, any other kind of providing the representation of the signal integrity identifiers may be possible.

In order to determine an appropriate signal integrity identifier for a section of the acquired waveform, the processing device 130 may evaluate one or more characteristic properties of the acquired waveform in the respective section. Such characteristic properties may be, for example, runts, glitches, duty cycle distortions, slew rates, cross talks, intersymbol interferences, reflections, ripples, noise (such as white noise, grey noise or pink noise), jitters.

Accordingly, processing device 130 may analyze the waveform in a section of the acquired waveform in order to determine whether the waveform in the respective section is error-free, i.e. no distortions or failures with respect to a desired waveform are detected in the respective section, or whether a specific distortion or failure is detected in the respective section of the waveform. The evaluation of the waveform in the respective section may be executed in a suitable manner According to one particular preferred technique, a histogram of the waveform is computed and the corresponding histogram data are evaluated in order to determine a signal integrity identifier of the respective section. The technique of providing a histogram and evaluating the histogram data will be described in more detail below. Although the histogram based evaluation technique is pretty smart for maintaining signal integrity information, however, it is understood that any other appropriate scheme or technique for determining an appropriate signal integrity identifier for a section of the acquired waveform may be also employed.

The signal integrity identifiers of the individual sections of the waveform may be provided in any appropriate manner. For example, a signal integrity identifier related to a specific section of the waveform may be recorded within the measurement device 100, for example in the memory 160. Additionally, or alternatively, it may be also possible to forward the signal integrity identifier information to further devices, for instance via a corresponding wired or wireless communication link (not shown in FIG. 1).

Furthermore, the signal integrity identifier may be output directly by the output device 140. In particular, an optical representation of the signal integrity identifier can be displayed on a display or screen. An acoustical representation of the signal integrity identifier can be output using a loudspeaker.

Output device 140 may provide a representation of the signal integrity identifiers associated to the respective sections of the acquired waveform, for instance by using a graphical representation, an alphanumeric element, a color output, an audio output and the like. For example, a frequency of an acoustic output signal may change depending on the corresponding signal integrity identifier. Alternatively, no acoustical output will be generated and output if the related section of the acquired waveform is error-free, so that in this example an acoustical signal is only provided upon detecting a distortion of failure in the related section of the acquired waveform. However, any other scheme for outputting an acoustical signal may be possible, too. Furthermore, the representation of the signal integrity identifier may be also provided by optical elements, for example by a visualization of the signal integrity identifiers assigned to the sections of the acquired waveform.

Figure 2:
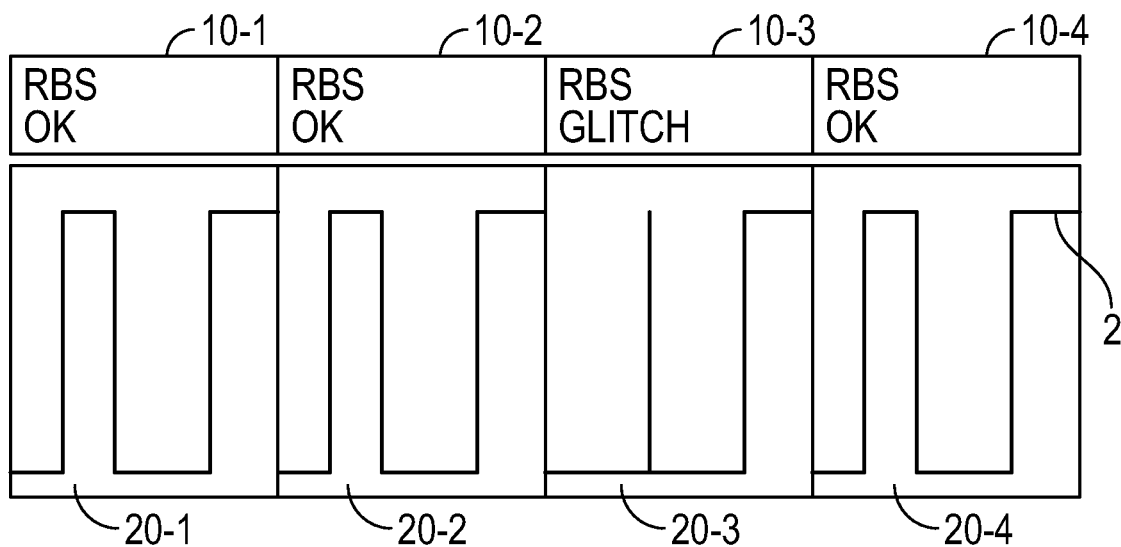
FIG. 2: shows an exemplary illustration for providing a result of an analysis according to an embodiment.

FIG. 2 shows an exemplary representation of signal integrity identifiers associated to segments of an acquired waveform.

In the example of FIG. 2, the signal waveform 2 is divided into at least four sections 20-i. The reference symbols 10-i denote representations of the signal integrity identifiers in association with the related sections 20-i of the acquired signal waveform 2. It is understood that the example of only four sections or segments (with i=4) is only for illustrative purposes and does not limit the scope of the present invention as any number of sections or segments 20-i is possible.

In the example according to FIG. 2, the waveform 2 of the measurement signal is a pulse signal, in particular a pulse signal having a specific duty cycle. It is assumed that the pulses in the first, second and fourth section 20-1, 20-2, 20-4 fit the desired requirements of the signal. Accordingly, the signal integrity identifier of the first, second and fourth section 20-1, 20-2, 20-4 specify that the respective waveforms are error-free. This may be indicated by providing the alphanumeric element "OK" as representations 10-1, 10-2 and 10-4 of the related signal integrity identifiers. In the third section 20-3 a glitch is detected. Then, the representation 10-3 of the third segment 20-3 may specify "GLITCH" to indicate the detected glitch in the third segment.

Accordingly, in the example of FIG. 2 the representations 10-i for the signal integrity identifiers of the individual sections 20-I are provided in text form.

By providing the representations 10-i of the signal integrity identifiers together with the graphical representation of the signal waveform 2 of the measurement signal, a user can easily identify abnormalities such as distortions or failures in the signal waveform 2 of the measurement signal. Furthermore, by providing an abstract representation, for example an alphanumeric element such as a text, the user can directly extract the respective distortion or failure information.

Furthermore, it may be also possible to change a color of the signal curve 2 and/or the representations 10-i of the signal integrity identifiers depending on the respective signal integrity identifier. For example, an error-free section may be displayed in a first color, for example green, and failures or distortions may be provided in one or more further colors, for example red. In particular, either the representation itself or the background of the representation may change the color depending on the related signal integrity identifier.

Figure 3:
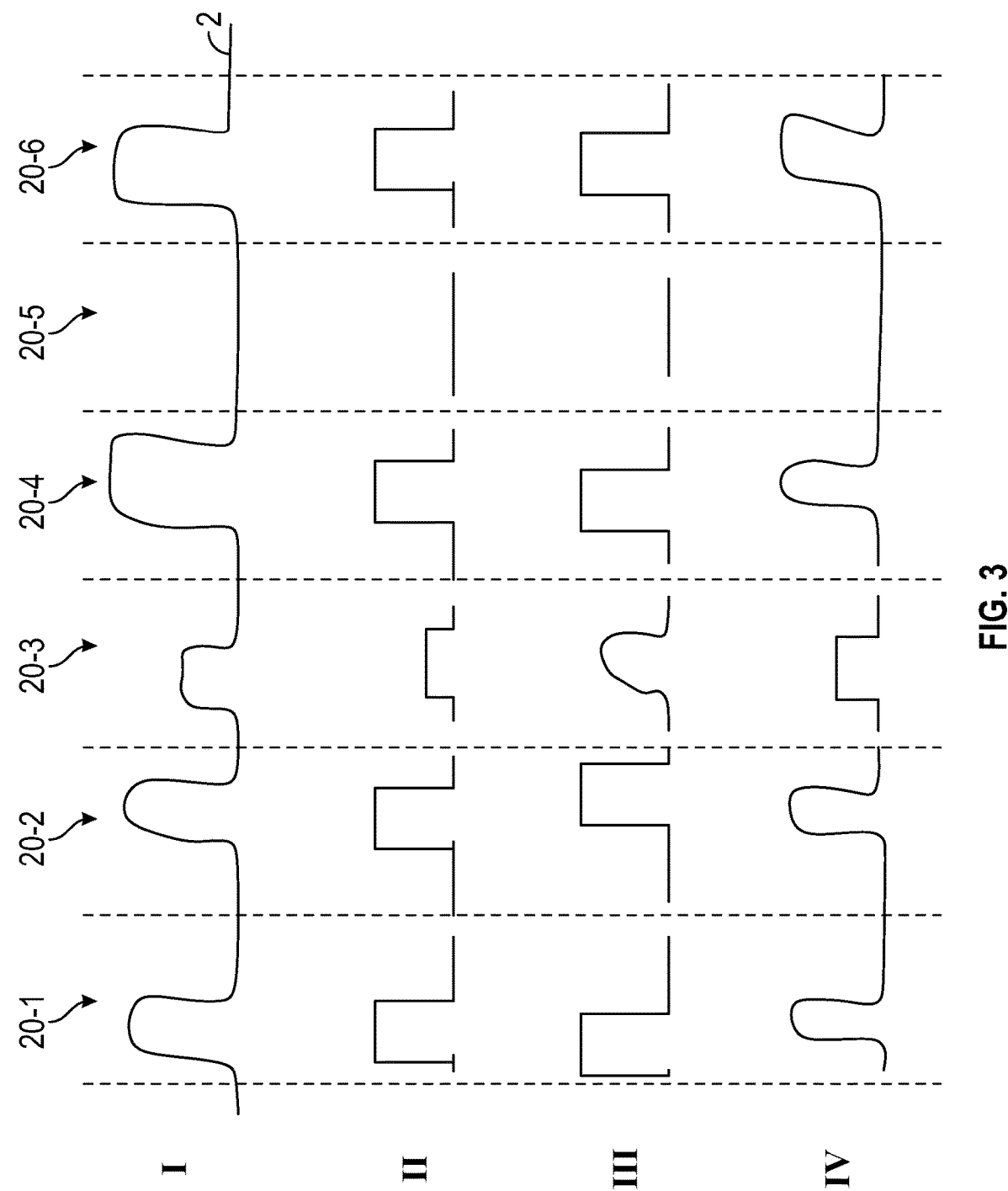
FIG. 3: shows a number of alternative possibilities for providing the results of the analysis of a waveform of a signal according to embodiments.

FIG. 3 shows some further examples for providing representations of signal integrity identifiers associated to sections of an acquired waveform.

In this example, six sections 20-i of the waveform 2 of a measurement signal 2 are illustrated. In the first row I, the pulse is at a beginning of this first section 20-1. In the second section 20-2, the pulse is at the ending of the section 20-2. In the third section 20-3, a runt is present, i.e. the pulse has a limited amplitude. The fourth and the six section 20-4, 20-6 have their pulses in the center of the section. The fifth section 20-5 does not comprise a pulse at all.

As can be seen in the second row II of FIG. 3, a graphical representation of a signal integrity identifier may be provided. Accordingly, the position of the pulses may be shown accordingly in the first and the second section, and the runt of the signal may be illustrated by a pulse having only limited amplitude.

As can be further seen in the third row III of FIG. 3, it may be also possible to use abstract representations of the waveform for those sections, which relate to an expected (error-free) waveform. Furthermore, a section relating to a waveform with a distortion or error may be provided by indicating the real signal waveform. Accordingly, the third section 20-3 with a runt may be shown by providing the waveform of the runt, whereby the remaining sections are provided by abstract representations of the related waveforms.

In the fourth row IV of FIG. 3, only sections with a particular property, for example a distortion or an error, may be indicated by an abstract representation of the related signal integrity identifier, wherein the waveform of the remaining sections are illustrated by providing the real signal curve. Furthermore, it may be also possible to apply different colors depending on the associated signal integrity identifier or to perform any other modification.

In order to further assist a user, it may be possible to perform a further analysis of the individual sections of the acquired waveform. For example, a user may select a number of one or more sections, and the selected sections may be further analyzed. For example, the selected sections may be zoomed in with regard to the time and/or the amplitude. For this purpose, an automated selection may be performed for selecting a section of the waveform having a specific signal integrity identifier. For example, sections with a distortion or failure may be automatically selected.

It may also be possible to specify one or more particular signal integrity identifiers, and an automated selection of sections with the specified signal integrity identifiers is performed.

Furthermore, it may be possible to automatically perform a particular operation, for example a zooming operation on a signal integrity identifier assigned to a section of the acquired waveform. However, it is understood that any other kind of operation may be also applied automatically or semi-automatically based on an assigned signal integrity identifier.

Figure 4:
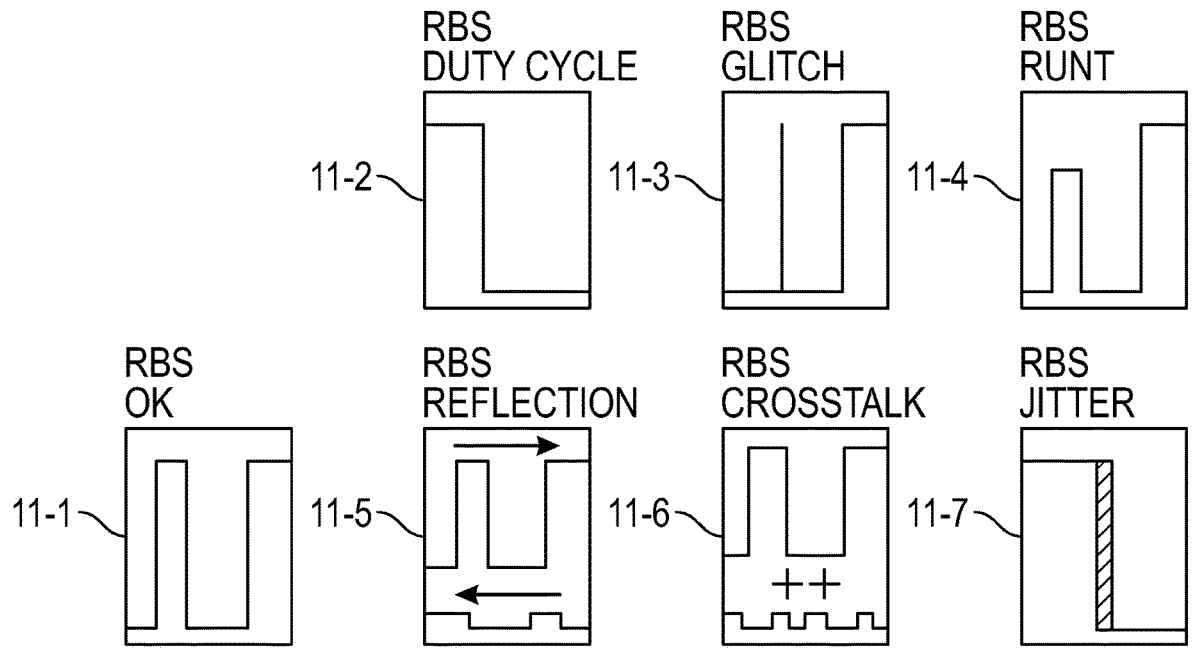
FIG. 4: shows a number of graphic representations for indicating signal integrity identifiers.

FIG. 4 shows some more examples of abstract graphical representations for signal integrity identifiers.

The first representation 11-1 of the related signal integrity identifiers assigned to a waveform of the measurement signal illustrates an error-free pulse signal. This is indicated with "RBS OK". The second representation 11-2 illustrates, for example, an abnormality in a duty cycle ("RBS DUTY CYCLE") of a pulse signal. Representation 11-3 may illustrate a glitch and representation 11-4 may illustrate a runt. Furthermore, representation 11-5 illustrates a reflection of a signal, and representation 11-6 illustrates a detected crosstalk. Further, representation 11-7 may illustrate a jitter. However, it is understood that any further property of a waveform may be also illustrated by appropriate graphical elements. Furthermore, as already discussed above, the respective signal integrity identifier may be also provided by alphanumeric elements, in particular by text or abbreviations.

Figure 5:
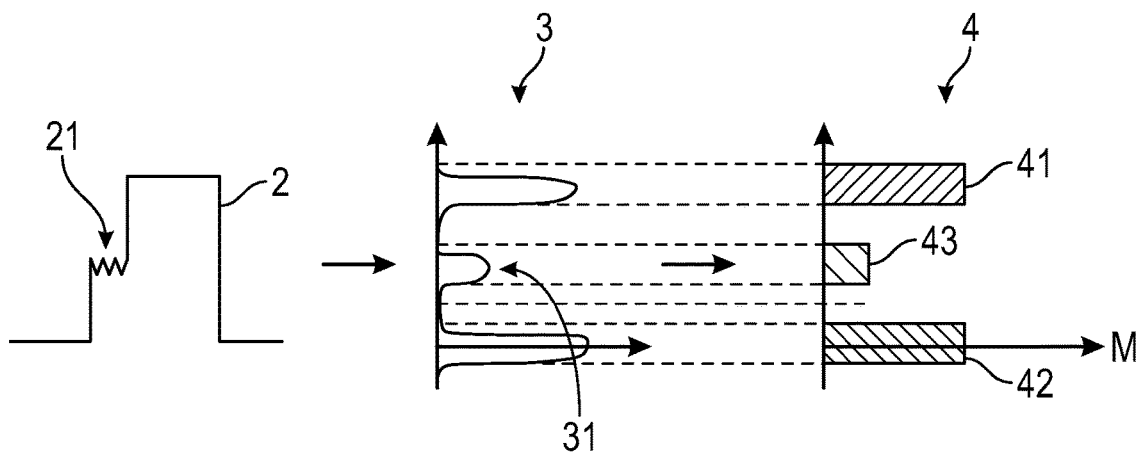
FIG. 5: shows a schematic illustration for computing histogram data according to an embodiment.

FIG. 5 shows a schematic diagram illustrating an approach for computing histogram data, in particular amplitude histogram data.

The computation of the histogram data may be performed, for instance, by employing an analyzing device 150 of the measurement apparatus 100. As can be seen in the left portion of FIG. 5, the pulse signal 2 in this section comprises a distortion 21. The resulting histogram 3 of the waveform in this section is shown in the center portion of FIG. 5, whereas the portion 31 of the histogram 3 results from the distortion 21.

In order to further simplify the histogram, the almost continuous distribution may be divided into a limited number of slices or pixels. This resulting pixel-like histogram 4 of the waveform in this section is shown in the right portion of FIG. 5. A similar technique as shown in the right portion of FIG. 3 may be employed here. For this purpose, the number of one or more threshold values may be applied and for each slice between neighboring thresholds values a corresponding histogram value is computed by counting the number of amplitude values in the respective slice.

As can be easily seen from this example, an error-free rectangular signal 2 would result to values in the top slice 41 and bottom slice 42 only, wherein the remaining slices would have almost no amplitude values. Due to the distortion 21 in the signal 2, at least some of the further slices 43 may also comprise a significant number of signal values. Accordingly, by analyzing the histogram data, a corresponding distortion or error can be detected directly. Thus, the signal integrity identifier may be determined based on the histogram data of a segment of the acquired waveform.

Figure 6:
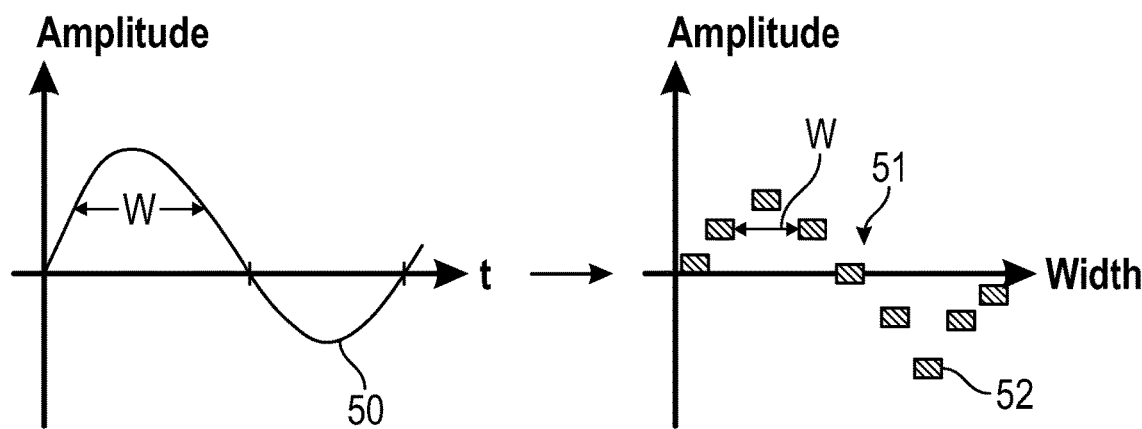
FIG. 6: shows a schematic illustration for computing histogram data according to a further embodiment.

FIG. 6 shows an example for determining a so-called width-histogram of a signal.

In the left portion of FIG. 6, a sine waveform of a measurement signal 50 is illustrated. In the right portion of FIG. 6, the corresponding width-histogram 51 is illustrated. In this width-histogram, the width W counts the number of samples between two signal values having same or similar amplitude and produces a corresponding number of slices or pixels 52. As already mentioned above, a number of one or more threshold values may be applied for slicing the histogram. The slicing may be applied with respect to the width W as well as with respect to the amplitude.

By computing histogram data of the values of a waveform a segment of the acquired wave-form, the amount of data can be reduced. Furthermore, the computation of the histogram data may be used as a kind of preprocessing for a further analysis of the measurement device of the waveform of a measurement signal. For example, the computed histogram data may be used for determining an appropriate signal integrity identifier of a section of the acquired waveform. For this purpose, it may be possible to compare the computed histogram data with predetermined patterns of histogram data.

In an example, it may be possible to compute a number of histogram patterns or fingerprints for a number of specific characteristic properties of a waveform signal. The patterns or fingerprints may be stored, for example in a memory 160 of the measurement device 100. Accordingly, the processing device 130 may compare a computed histogram of a section of the acquired waveform with the precomputed patterns or fingerprints in order to identify in corresponding signal integrity identifiers.

In another or alternative example, it may also be possible to use a suitable neural network for determining an appropriate signal integrity identifier. For this purpose, the measurement device 100 provides as an input vector a segment of an acquired waveform to the neural network and the neural network outputs an appropriate signal integrity identifier or a probability distribution for a number of signal integrity identifiers. The neural network may be implemented in the processing device 130.

Furthermore, in another example, computed histogram data of a section of the acquired waveform are used as an input vector of the neural network. Accordingly, the neural network only has to evaluate the histogram data for determining an appropriate signal integrity identifier or a probability distribution for multiple signal integrity identifiers. In this way, the computational effort can be reduced. Consequently, the required computational hardware can be simplified and/or the time for computing can be minimized.

In an embodiment, it may be further possible to store the computed histogram data in the memory 160. Accordingly, the recorded histogram data are further available for any kind of later operations. For example, the stored histogram data may be used for later displaying a signal curve, a zooming operation or any other processing of the stored histogram data. In this way, a later analysis and evaluation of the waveform can be performed.

Figure 7:
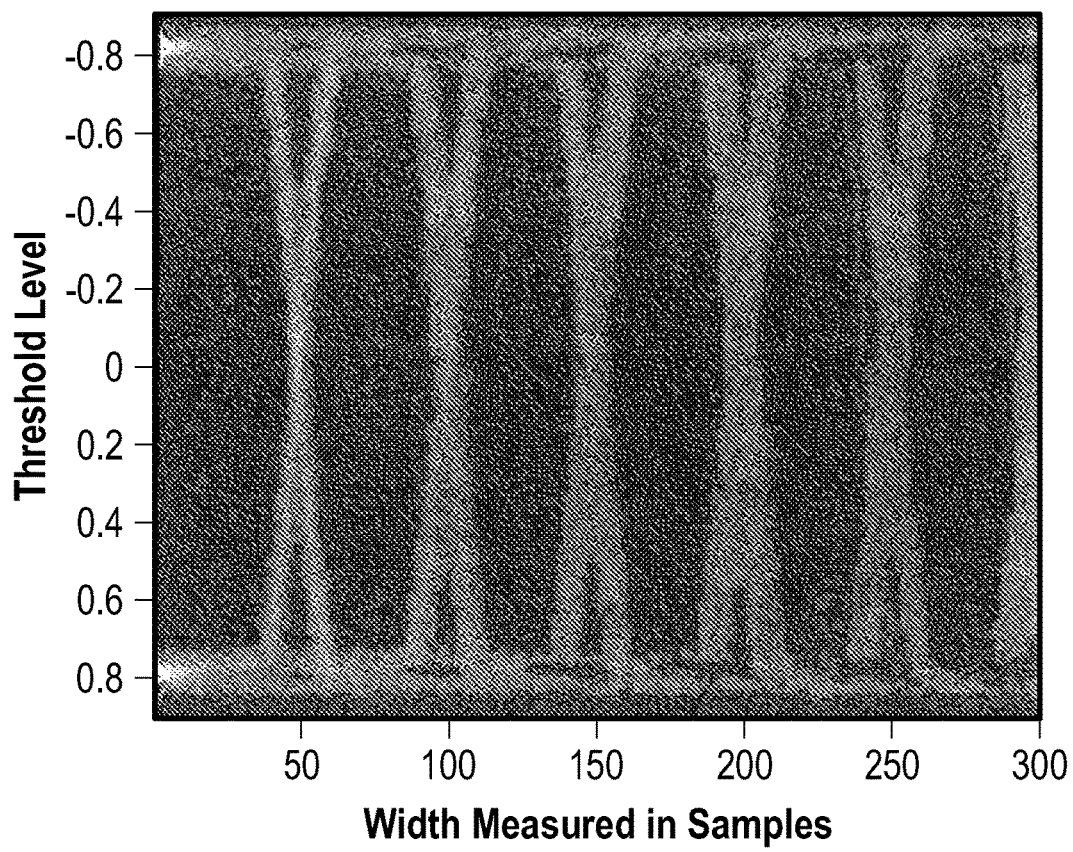
FIG. 7: shows an example of a width-histogram of a signal in the form of a so-called eye pattern.

FIG. 7 shows another example of a width-histogram of a signal in the form of a so-called eye pattern. The eye-pattern histogram is denoted by reference symbol 12.

In telecommunications, an eye pattern, also known as an eye diagram, is an oscilloscope display in which a digital measurement signal repetitively sampled and applied to the vertical input, while the data rate is used to trigger the horizontal sweep. It is so called because, for several types of coding, the pattern looks like a series of eyes between a pair of rails. It is a tool for the evaluation of the combined effects of channel noise and intersymbol interferences on the performance of a baseband pulse-transmission system. It is the synchronized superposition of all possible realizations of the signal of interest viewed within a particular signaling interval. Several system performance measures can be derived by analyzing the display. If the signals are too long, too short, poorly synchronized with the system clock, too high, too low, too noisy, or too slow to change, this can be observed from the eye diagram.

There are many amplitude measurements that can be obtained from an eye diagram, such as eye amplitude, eye crossing amplitude, eye crossing percentage, eye height, eye level, eye signal-to-noise ratio, quality factor, vertical eye opening and the like.

Figure 8:
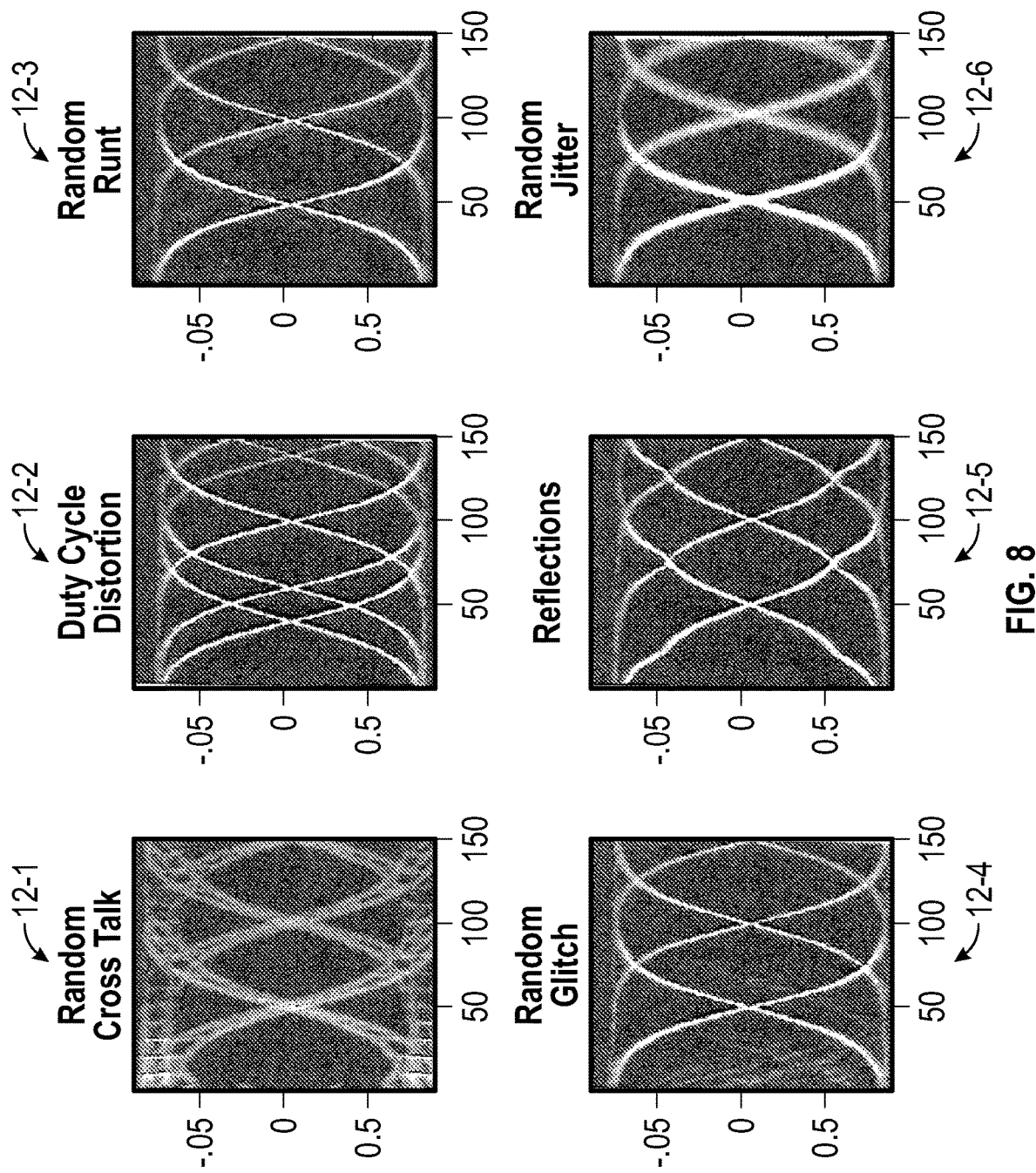
FIG. 8: shows an example of a time histogram of a signal in the form of a so-called eye pattern.

FIG. 8 shows another example of a time histogram of a signal in the form of a so-called eye pattern.

The first eye pattern 12-1 refers to a histogram representation of the measurement signal which illustrates a crosstalk of the measurement signal. The second eye pattern 12-2 refers to a histogram representation which illustrates the cycle distortion and the third eye pattern 12-3 illustrates a runt. Eye pattern representations 12-4 and 12-5 illustrate in the form of a histogram the glitches and reflections, respectively. Finally, the eye pattern 12-6 shows the histogram representation of a measurement signal for a jitter.

It is to be understood, that there are many time measurements that can be obtained from an eye diagram, such as deterministic jitter, eye crossing time, eye delay, eye fall time, eye rise time, eye width, horizontal eye opening, peak-to-peak jitter, random jitter, RMS jitter, CRC jitter, total jitter and the like.

Figure 9:
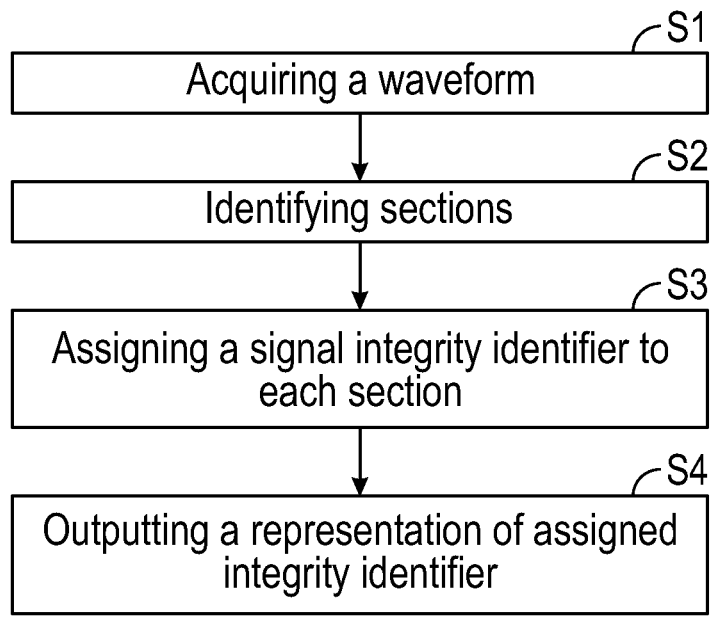
FIG. 9: shows a flow diagram of a method for analyzing a waveform according to an embodiment.

FIG. 9 shows a flow diagram of a method for analyzing a waveform of a signal.

The method comprises a step S1 of acquiring a waveform of a signal, and a step S2 of identifying a number of sections in the acquired waveform. The method further comprises a step S3 of assigning a signal integrity identifier to each section of the number of sections in the acquired waveform, and a step S4 of outputting the representation of the respective assigned signal integrity identifier for each section of the number of sections.

The signal integrity identifiers may be assigned based on at least one characteristic property of the waveform in the respective section.

The representation of the signal integrity identifier may comprise at least one of a graphical representation, an alphanumeric element, a color or an audio output.

In particular, a representation of the waveform of the signal may be displayed when outputting the representation of the respective signal integrity identifier. In particular, the representation of the waveform and the representation of the signal integrity identifier may be provided in association with each other.

The method may further comprise automatically zooming a displayed representation of the waveform of the signal relating to a predetermined signal integrity identifier.

The method may further comprise automatically selecting a section of the output representation related to a predetermined signal integrity identifier.

The method may further comprise computing a histogram of the acquired waveform of the signal. In particular, the histogram data may relate to an amplitude histogram and/or a width histogram.

When computing the histogram data, the waveform of the signal may be divided into a number of slices based on at least one threshold value, and the histogram data may be determined based on the sliced waveform.

In particular, the computed histogram data may comprise a pulse-width histogram.

Accordingly, the identification of the individual sections in the acquired waveform may be performed based on the determined histogram data.

Additionally, or alternatively, the assigning of a signal integrity identifier or a section of the acquired waveform may be performed based on the determined histogram data.

In particular, a neural network may be used for identifying the sections of the waveform and/or for assigning the signal integrity identifier of a section of the waveform.

Summarizing, the present invention relates to an analysis of a waveform of a signal. It is for this purpose that the waveform of the signal is divided into multiple sections and a signal integrity identifier is assigned to each section. Accordingly, a representation of the respective signal integrity identifier may be provided for each section of the waveform. The representation of the signal integrity identifier may comprise an abstract representation, for example a graphical element, an alphanumeric element, a color or even an audio signal.

In principle it would also be possible to feed the measurement signal directly to the signal characterization neural network. However, this would need immense computational effort and the system would not be fast enough or not real-time capable. By employing a decimation technique based on histogram data, the signal characterization neural network is capable to perform the computation much faster and is able to recognizes much faster whether an measurement signal has a rare characteristic property or not.

Figure 10:
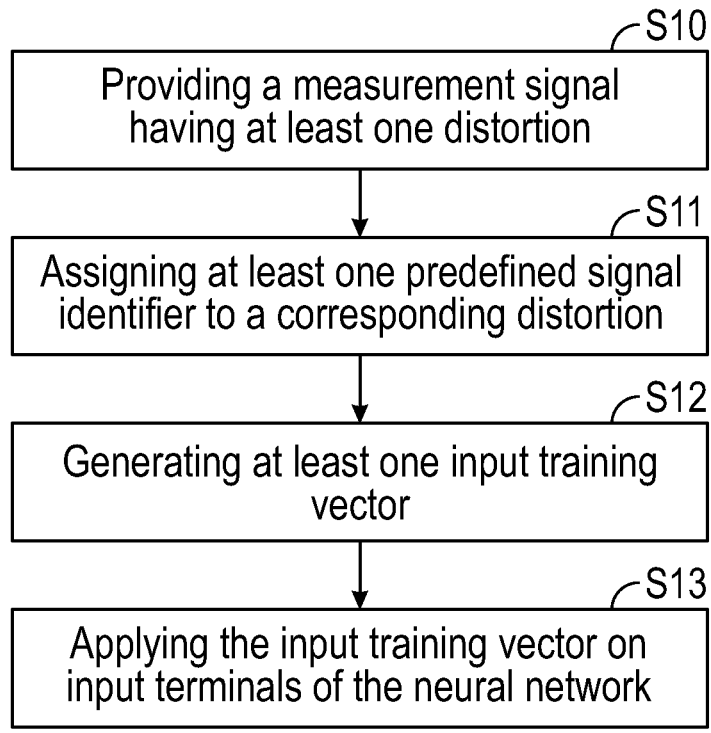
FIG. 10: shows a flow diagram of a method for training a signal characterization neural network according to another embodiment.

FIG. 10 shows a flow diagram of a method for training a signal characterization neural network. A signal characterization neural network denotes a neural network which is configured such to process and characterize input signals such as measurement signals.

In a first step S10, a measurement signal having at least one distortion is provided. The distortion may comprise a runt, a glitch, a duty cycle distortion, a slew rate, a crosstalk, intersymbol interferences, reflections, ripples, jitters, noise or the like.

In a next step S11, the method comprises the assigning of at least one predefined signal integrity identifier to a corresponding distortion within the measurement signal.

Then in step S12, at least one input training vector is generated. Here, the input vector is generated based on the provided measurement signal and the corresponding assigned signal integrity identifier.

In a final step S13, the generated input training vector is applied on input terminals of the signal characterization neural network. This way, it is possible to train the signal characterization neural network based on known and predefined distortions within a measurement signal.

In an optional step, a histogram representation of the measurement signal is generated. The histogram representation is preferably used for generating the input training vector. For providing the histogram representation, any suitable technique may be applied, such as a pulse-width histogram, a time histogram, an eye pattern and the like. Generating a histogram representation includes applying at least one predefined threshold to the measurement signal and iteratively slicing the provided measurement signal based on the predefined threshold. Then, the iteratively sliced measurement signals are overlaid in order to generate the histogram representation of the measurement signal.

For providing the histogram data, a histogram based data generation and evaluation technique such as described above with regard to the embodiments in FIG. 1-9 may be employed.

Figure 11:
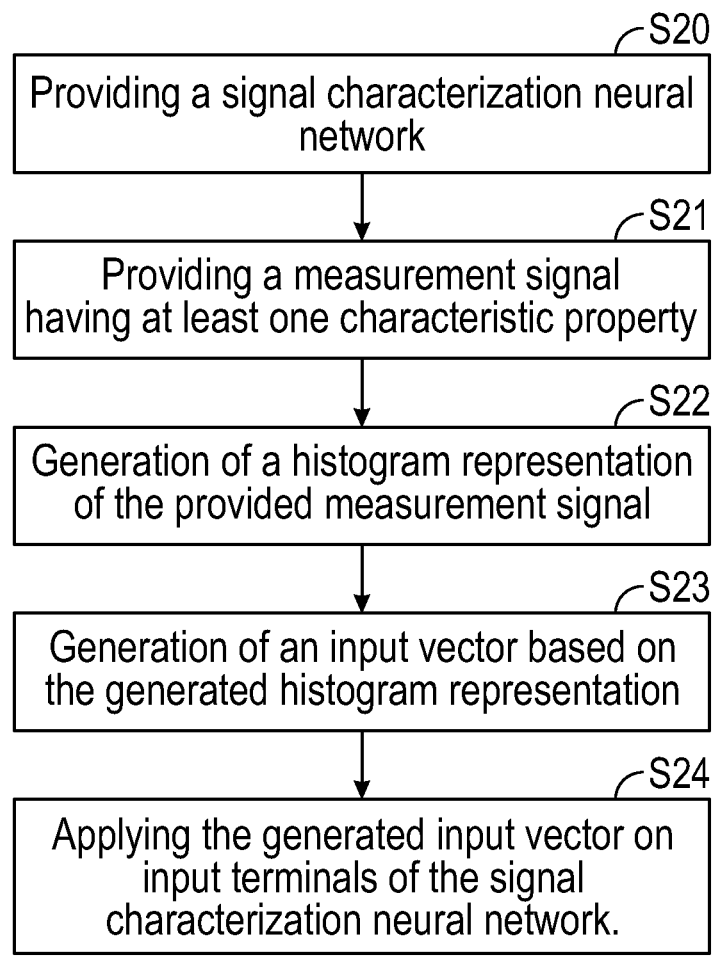
FIG. 11: shows a flow diagram of a method for automatically characterizing a measurement signal according to a further embodiment.

FIG. 11 shows a flow diagram of a method for automatically characterizing a measurement signal.

In the two initial steps S20, S21, a signal characterization neural network and a measurement signal having at least one characteristic property is provided. The characteristic property may be a runt, a glitch, a duty cycle distortion, a slew rate, a crosstalk, intersymbol interferences, reflections, ripples, jitters, noise or the like.

In a next steps S22 and S23, the method comprises the generation of a histogram representation of the provided measurement signal and of an input vector based on the generated histogram representation. Again, for providing the histogram representation, any technique described above may be employed.

In a final step S24, the generated input vector is applied on input terminals of the signal characterization neural network. This way, it is possible to automatically identify the at least one characteristic property within the provided measurement signal.

This way, the methods described with regard to FIGS. 10 and 11 employ a kind of a decimation technique which is applied to an input signal such as a measurement signal. This decimation technique provides a kind of data compression, however, by maintaining the signal integrity to the full extent. By reducing the data to be evaluated by the processing device in the way sketched above, it is possible to buy the time needed for properly real-time training and real-time analyzing the measurement signal, respectively, with no or at least hardly any blind times.

Although the present invention has been described in the above by way of preferred embodiments, it is not limited thereto, but rather can be modified in a wide range of ways. In particular, the invention can be changed or modified in various ways without deviating from the core of the invention.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon re-viewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not in-tended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

REFERENCE NUMERALS 2 signal waveform/curve of the measurement signal
3 histogram
4 pixel-like histogram
10-$i$ representations
11-$i$ representation of the related signal integrity identifiers
12 eye-pattern histogram
12-$i$ eye pattern histogram
20-$i$ segments, sections
21 distortion in the signal waveform
31 portion of the histogram referring to a distortion
41 slice/portion of pixel-like histogram referring to no distortion
42 slice/portion of pixel-like histogram referring to no distortion
43 portion of the pixel-like histogram referring to a distortion
50 waveform of a measurement signal
51 width-histogram
52 slices, pixels
100 measurement apparatus
101 input signal, measurement signal
110 acquisition device
120 segmenting device
130 processing device
140 output device
150 analyzing device
160 memory
I-IV rows
W width
S1-S4 steps
S10-S13 steps
S20-S24 steps

What I claim is:

1. A method for training a signal characterization neural network, the method carried out by a processor of a measurement apparatus and comprising:
    providing a measurement signal having at least one distortion;
    assigning at least one predefined signal integrity identifier to a corresponding distortion within the measurement signal;
    generating at least one input training vector based on the provided measurement signal and the corresponding assigned signal integrity identifier; and
    applying the generated input training vector on input terminals of the signal characterization neural network for training the signal characterization neural network.

2. The method of claim 1, wherein an assigned signal integrity identifier refers to at least one of the following distortions within a measurement signal:
    a runt,
    a glitch,
    a duty cycle distortion,
    a slew rate,
    a crosstalk,
    intersymbol interferences,
    reflections,
    ripples,
    jitters,
    noise.

3. The method of claim 1, wherein the measurement signal is provided by a device under test.

4. The method of claim 1, wherein the measurement signal is provided by a signal generator.

5. The method of claim 1, wherein the measurement signal is provided by an oscilloscope or a spectrum analyzer.

6. The method of claim 1, wherein the measurement signal is provided by a software application.

7. A method for training a signal characterization neural network, the method carried out by a processor of a measurement apparatus and comprising:
    providing a measurement signal having at least one distortion;
    assigning at least one predefined signal integrity identifier to a corresponding distortion within the measurement signal;
    generating at least one input training vector based on the provided measurement signal and the corresponding assigned signal integrity identifier; and
    applying the generated input training vector on input terminals of the signal characterization neural network for training the signal characterization neural network;
    and further comprising:
    generating a histogram representation of the measurement signal, wherein the generated histogram representation is used for generating the input training vector.

8. The method of claim 7, wherein generating a histogram representation further comprises:
    applying at least one predefined threshold to the provided measurement signal;
    iteratively slicing the provided measurement signal based on the predefined threshold;
    overlaying the iteratively sliced measurement signal to form the histogram representation of the measurement signal.

9. The method of claim 7, wherein the histogram representation is provided in the form of a pulse-width histogram.

10. The method of claim 7, wherein the histogram representation is provided in the form of a time histogram.

11. The method of claim 7, wherein the histogram representation is provided in the form of an eye pattern.

12. A method for automatically characterizing a measurement signal, the method carried out by a processor of a measurement apparatus and comprising:
providing a signal characterization neural network;
providing a measurement signal having at least one characteristic property;
generating a histogram representation of the provided measurement signal;
generating an input vector based on the generated histogram representation;
applying the generated input vector on input terminals of the signal characterization neural network for automatically identifying the at least one characteristic property within the provided measurement signal.

13. The method of claim 12, wherein the characteristic property refers to at least one of the following distortions within the measurement signal:
a runt,
a glitch,
a duty cycle distortion,
a slew rate,
a crosstalk,
intersymbol interferences,
reflections,
ripples,
jitters,
noise.

14. The method of claim 12, wherein the measurement signal is provided by at least one of:
a device under test;
a signal generator;
an oscilloscope;
a spectrum analyzer;
software application.

15. A method for automatically characterizing a measurement signal, the method carried out by a processor of a measurement apparatus and comprising:
providing a signal characterization neural network;
providing a measurement signal having at least one characteristic property;
generating a histogram representation of the provided measurement signal;
generating an input vector based on the generated histogram representation;
applying the generated input vector on input terminals of the signal characterization neural network for automatically identifying the at least one characteristic property within the provided measurement signal;
wherein the generated histogram representation is provided in the form of at least one of:
a pulse-width histogram;
a time histogram;
an eye pattern.

16. A measurement apparatus for analyzing a waveform of a signal, the apparatus comprising:
an acquisition device which is configured to acquire a waveform of a signal;
a segmenting device which is configured to identify a number of sections in the acquired waveform;
a processing device which is configured to assign a signal integrity identifier to each section of the number of sections in the acquired waveform; and
an output device which is configured to output, for each section of the number of sections, a representation of the respective assigned signal integrity identifier.

17. The measurement apparatus of claim 16, wherein the representation of the signal integrity identifier comprises at least one of:
a graphical representation,
an alphanumeric element,
a color,
an audio output.

18. The measurement apparatus of claim 16, wherein the output device is configured to display a representation of the waveform of the signal, and to output the representation of the signal integrity identifier in association with the displayed representation of the waveform of the signal.

19. The measurement apparatus of claim 18, wherein the output device is configured to automatically zoom the displayed representation of the waveform of the signal relating to a predetermined signal integrity identifier.

20. The measurement apparatus of claim 16, further comprising a selection device, wherein the selection device is configured to automatically select a section of the output representation of the respective assigned signal integrity identifier which relates to a predetermined signal integrity identifier.

21. The measurement apparatus of claim 16, further comprising an analyzing device, wherein the analyzing device is configured to compute histogram data of a section of the acquired waveform of the signal.

22. The measurement apparatus of claim 21, wherein the processing device is configured to compare the computed histogram data with a number of prestored reference data and to assign the respective signal integrity identifier based on a result of the comparison.

23. The measurement apparatus of claim 21, wherein the analyzing device is configured to divide the waveform of the signal into a number of slices based on at least one threshold value, and to generate the histogram data based on the sliced waveform.

24. The measurement apparatus of claim 21, wherein the computed histogram data comprises a pulse-width histogram.

25. The measurement apparatus of claim 21, wherein the segmenting device is configured to identify the sections in the acquired waveform based on the computed histogram data.

26. The measurement apparatus of claim 21, wherein the processing device is configured to assign the signal integrity identifiers based on the determined histogram data.

27. The measurement apparatus of claim 21, wherein the analyzing device comprising a neural network for identifying sections of the waveform or for assigning a signal integrity identifier to a section of the waveform.

28. The measurement apparatus of claim 21, further comprising a memory, wherein the memory is configured to store the computed histogram data.

29. A measurement apparatus for analyzing a waveform of a signal, the apparatus comprising:
an acquisition device which is configured to acquire a waveform of a signal;
a segmenting device which is configured to identify a number of sections in the acquired waveform;
a processing device which is configured to assign a signal integrity identifier to each section of the number of sections in the acquired waveform; and an output device which is configured to output, for each section of the number of sections, a representation of the respective assigned signal integrity identifier;

wherein the processing device is configured to assign the signal integrity identifiers based on at least one characteristic property of the acquired waveform in the respective section.

30. The measurement apparatus of claim 29, wherein the at least one characteristic property comprises at least one of:
a runt,
a glitch,
a duty cycle distortion,
a slew rate,
a crosstalk,
intersymbol interferences,
reflections,
ripples,
jitters,
noise.

31. A method for analyzing a waveform of a measurement signal, the method comprising:
acquiring a waveform of a measurement signal;
identifying a number of sections in the acquired waveform;
assigning a signal integrity identifier to each section of the number of sections in the acquired waveform; and
outputting a representation of the respective assigned integrity identifier for each sections of the number of sections;
wherein the assigning the signal integrity identifier to each section comprises assigning the signal integrity identifiers based on at least one characteristic property of the acquired waveform in the respective section.

* * * * *